United States Patent [19] [11] 4,110,709
Day, Jr. [45] Aug. 29, 1978

[54] APPARATUS FOR COUPLING MICROWAVE ENERGY FROM TWO OSCILLATORS TO A COMMON TRANSMISSION LINE

[75] Inventor: Walter Ransom Day, Jr., Menlo Park, Calif.

[73] Assignee: Litton Systems, Inc., San Carlos, Calif.

[21] Appl. No.: 764,008

[22] Filed: Jan. 31, 1977

[51] Int. Cl.[2] .......... H01P 5/12; H03H 7/46
[52] U.S. Cl. .......... 333/6; 331/56; 343/176
[58] Field of Search .......... 333/6, 9; 331/46, 49, 331/56; 325/51, 52; 343/176, 858

[56] References Cited

U.S. PATENT DOCUMENTS

| | | | |
|---|---|---|---|
| 1,721,567 | 7/1929 | Martin | 333/9 X |
| 2,019,341 | 10/1935 | Dome | 343/858 |
| 2,258,148 | 10/1941 | Schussler | 343/858 X |
| 2,495,589 | 1/1950 | Masters | 343/852 |
| 2,567,197 | 9/1951 | Fox | 325/24 |
| 2,658,148 | 11/1953 | Evans et al. | 331/56 |
| 2,711,516 | 6/1955 | Fredendall | 333/75 |
| 2,717,360 | 9/1955 | Price | 333/6 |
| 2,861,245 | 11/1958 | Krause | 333/9 |
| 2,909,774 | 10/1959 | DeBell, Jr. | 343/176 |
| 2,948,863 | 8/1950 | Honda | 333/10 |
| 3,034,076 | 5/1962 | Tomiyasu | 333/9 |
| 3,252,112 | 5/1966 | Hauer | 331/56 X |
| 3,400,339 | 9/1968 | Shone | 333/9 |

*Primary Examiner*—Paul L. Gensler
*Attorney, Agent, or Firm*—Ronald M. Goldman

[57] ABSTRACT

A microwave system provides signals of two separate microwave frequencies, designated $F_{(1)}$ and $F_{(2)}$, alternately or simultaneously to a common coaxial transmission line by combining the outputs of two microwave frequency oscillators of frequencies $F_{(1)}$ and $F_{(2)}$. Each oscillator contains a waveguide output with which is associated at least one means, such as a resonant iris, for passing microwave energy of the oscillator's design frequency and for reflecting microwave energy of other frequencies, such as the different frequency of the other oscillator. A waveguide type transmission line is provided having first and second input ends and which line is of a length so as to be nonresonant at either of the two oscillator frequencies, $F_{(1)}$ or $F_{(2)}$. Each oscillator is coupled to a corresponding one of the two input ends of the waveguide. The waveguide is of a length in which signals of frequency $F_{(1)}$ form a field maxima at a certain location along the waveguide and in which signals of frequency $F_{(2)}$ form a field maxima along the waveguide at essentially the same said location. A microwave energy coupling probe is positioned in the waveguide at the location thereby defined to extract the microwave energy from the waveguide.

8 Claims, 5 Drawing Figures

APPARATUS FOR COUPLING MICROWAVE ENERGY FROM TWO OSCILLATORS TO A COMMON TRANSMISSION LINE

BACKGROUND OF THE INVENTION

The present invention relates to a plural oscillator microwave frequency system in which at least two oscillators of distinct different frequencies have the outputs combined and applied in common to a coaxial type transmission line and, more particularly, to a novel microwave subsystem in which the outputs of two oscillators of different frequency are diplexed without significant interactive interference between the oscillators.

Various microwave systems, such as radars and electronic countermeasure equipments, known to those skilled in the art, employ one or more microwave frequency sources or oscillators, as variously termed, to provide electromagnetic signals in the microwave frequency region for various applications. In some systems, I am advised, there is need to combine or couple the outputs of two oscillators operating at different frequencies, designated generally as $F_{(1)}$ and $F_{(2)}$, to a common coaxial type transmission line over which the signals may propagate to other circuits, not here relevant, within the microwave system. Either one or the other of such oscillators may be activated to provide signals of frequency $F_{(1)}$ or $F_{(2)}$, respectively, or both of such oscillators are simultaneously activated to provide an output signal of frequency $F_{(1)}$ and $F_{(2)}$. Simple as that may seem to the lay person, the goal has not been, in my opinion, whether or not signal combining may be accomplished but whether or not such combining can be accomplished by a simple structure without exceptional losses of microwave frequency power and without interactive interference between the oscillators, such as where one oscillator could become an electrical load to the other oscillator causing power losses or possible damage or both. Device damage is particularly undesirable in the case of modern solid state IMPATT diode type or FET type oscillators, containing the sensitive and easily damaged IMPATT diode or FET as the microwave frequency generating devices, although that is not a problem, in my opinion, with Gunn diode type solid state oscillators with which the invention is also used. I believe that prior apparatus exists by means of which separate oscillators may have their outputs combined for application to a single coaxial type transmission line. These I refer to by the common names, understood by those skilled in the art, as a hybrid combiner, a "rat race" circulator, and a "hybrid T". As those skilled in the art of these devices may attest, such devices, although suitable for the purpose, are either very complex to manufacture and adjust or are large and bulky, or involve a combination of both problems, in my opinion.

Another prior art structure made known to the applicant appears in the triplexing device presented in U.S. Pat. No. 2,909,774 to deBell. That device includes at least two oscillators coupled to two sections of coaxial line which are then joined to a third tri-coaxial line. The two oscillators are specified to bear a frequency relationship to one another in a multiple, and incorporates four coaxial stub tuners, two of which are located proximate the oscillator end of the associated coaxial line section of one oscillator and two proximate the other oscillator. One tuner adjacent the first oscillator is tuned together with the associated coaxial line section so that the input to the associated coaxial line section presents a high impedance at the frequency of the second oscillator, as well as a short circuit to energy of the second oscillator at the end of the coaxial line section to where the first oscillator is coupled, and vice-versa in the case of the coaxial tuning stub associated with the first oscillator. The remaining two stubs are intended to adjust the line to cancel the effect of the associated tuning stubs. In the deBell structure, open circuit tuning stubs are employed which would appear to allow microwave radiation to escape to the surrounding ambient, possibly causing interference. Also those skilled in the art recognize the "narrow-band" characteristic and sensitivity of tuning stub devices, which encourages misoperation, particularly if either oscillator drifts in frequency or is modulated as might defeat the intended operation of the deBell device, and recognize as well the overall complexity and awkwardness of the mechanical structure. Although complexity of adjustment and manufacture is to be avoided, bulkiness is particularly undesired in modern day airborne radar and countermeasure systems in which space and size are at a premium and in which one usually wishes to obtain the size reductions permissible with the modern solid state semiconductor oscillators which in size may be no more than 6 inches × 5 inches × 4 inches in dimension.

A prime object of my invention is to provide microwave apparatus which satisfactorily combines the outputs of two oscillators of distinct frequency to a common output in a relatively uncomplicated novel arrangement of reduced overall size.

SUMMARY OF THE INVENTION

To that end, the invention employs two oscillators of frequency $F_{(1)}$ and $F_{(2)}$, respectively, each of which has a waveguide type output, such as a waveguide flange; a waveguide type transmission line of an overall length, L, in which the length is different from $N\lambda g/2$ at either of the frequencies $F_{(1)}$ and $F_{(2)}$, where N is an integer and $\lambda g$ is an in-the-waveguide wavelength, so that the transmission line is nonresonant; means associated with each respective oscillator, such as a resonant iris, are included to pass signals from the associated oscillator into the waveguide and reflect signals of other frequencies, such as signals from the other oscillator; and a microwave field coupling means for coupling microwave energy from within the waveguide is located at a position therewithin between the ends of the waveguide where the field of microwave energy from oscillator $F_{(1)}$, coupled into the waveguide from one end, is at a maximum and where the field of microwave energy from oscillator $F_{(2)}$, coupled into the waveguide from the other end, is also at a maximum, the sum of such distances serving to define the waveguide length, L.

In a more specific aspect of the invention, the microwave field coupling means comprises a microwave energy coupling "probe", which couples to the E fields, and the position of said probe within said waveguide is defined essentially by the following distances: $(2N+1)\lambda g/4$ at frequency $F_{(1)}$ from the one end of the waveguide to which the oscillator of frequency $F_{(2)}$ is coupled; and the distance $(2N+1)\lambda g/4$ at frequency $F_{(2)}$ from the remaining waveguide end to which the oscillator of frequency $F_{(1)}$ is coupled. In an alternative aspect of the invention the microwave field coupling means comprises a coupling "loop", which couples to the H fields, and the position of said coupling loop within the waveguide is defined essentially by the distance $N\lambda g/2$ at frequency $F_{(2)}$ from the remaining waveguide end to which the oscillator of frequency $F_{(1)}$ is coupled.

In another specific aspect of the invention, the last named means may comprise a resonant iris or a narrow band isolator or a combination of an iris and an isolator, with the pass band of the resultant combination being such as to be less than the frequency difference $F_{(1)}$-$F_{(2)}$. In another aspect of the invention, the output probe may comprise an E field coupling probe connected to a broad band isolator having a coax type output. In connection with the invention, the properly dimensioned waveguide transmission line may appear in form as a straight, bent, or curved line configuration in any of the species of the invention.

The foregoing objects and advantages of the invention, together with the structure characteristic thereof, which the foregoing briefly summarizes, is better understood by considering various preferred embodiments of the invention as are presented in the detailed description, which follows, considered in connection with the illustrations thereof presented in the figures of the drawings.

DESCRIPTION OF THE PREFERRED EMBODIMENTS

Figure 1:
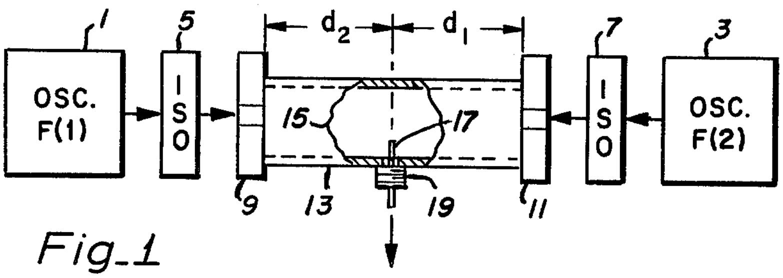
FIG. 1 illustrates a first embodiment of the invention in symbolic form.
Figure 2:
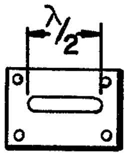
FIG. 2 illustrates in front view, a resonant iris.

Reference is made to the embodiment of the invention presented in FIG. 1. As is apparent to the reader, the elements presented in the structure of the embodiment of FIG. 1 are represented in symbolic form, and the reader notes essentially that the elements from which the invention is constructed as a combination are made from existing component elements. Thus, a first oscillator 1 and a second oscillator 3 are depicted. The output of oscillator 1 is coupled, as represented by the arrow, to the input of an isolator 5 and oscillator 2 is connected, as represented by the arrow, to the input of a second isolator 7. The output of isolator 5 is connected serially with a resonant iris 9 and, correspondingly, the output of isolator 7 is serially connected with a resonant iris 11. Oscillators 1 and 3 may be of any conventional type, suitably a solid state Gunn diode type oscillator having a waveguide type output and utilizing the microwave energy generating characteristics of a Gunn diode known in the art in a known circuit arrangement, including power supplies and "on-off" control switches, which are not separately illustrated here because of their conventional nature, to supply microwave frequency energy of a first frequency, such as designated $F_{(1)}$. The oscillator 3 may be essentially identical in structure but tuned so as to provide a microwave output signal of a different frequency, designated $F_{(2)}$. By means, not here illustrated, each of the oscillators may be coupled to suitable conventional control circuitry, which simultaneously or individually control the "on"0 or "off" condition of the oscillators. Isolators 5 and 7 may be of any conventional structure compatible with the associated oscillator and which provides the conventional function of passing the microwave energy in one direction from the associated oscillator while substantially inhibiting return microwave energy. These, of course, are of conventional structure and may be found in the literature. Each of the resonant irises 9 and 11 is also of a conventional structure, such as depicted in FIG. 2, and essentially contains a slot of a length equal to one-half wavelength at the frequency of the associated oscillator. Thus iris 9 has a slot or coupling iris of a length equal to one-half of the wavelength of frequency $F_{(1)}$ and resonant iris 11 contains a slot equal to one-half the wavelength of oscillator $F_{(2)}$. As becomes more apparent hereafter, the iris possesses an electrical characteristic useful in the operation of the invention, namely, the iris passes microwave energy of the frequency to which it is tuned or at which the slot length equals a half wavelength, and it substantially reflects or acts as a short-circuit to microwave energy of a frequency significantly different from that to which it is tuned. In this connection, it is noted that the frequency of the first oscillator $F_{(1)}$ must be significantly different from the frequency of the second oscillator $F_{(2)}$ by at least $\Delta F$, by an amount equal at least to the "passband" characteristic of the iris, $\Delta F$, for example, where $\Delta F$ equals $F_{(1)}$-$F_{(2)}$. Connected between irises 9 and 11 is a waveguide 13, a conventional transmission line element used to propagate microwave energy. This waveguide is depicted as a straight section of a predetermined length, L, and containing, for purposes of illustration, a cut-away portion 15 to illustrate the internal area, including the end of a probe 17, which protrudes through an opening in the bottom wall of the waveguide so as to be placed in an electric field at a point of maximum intensity. The probe 17 is of any conventional structure typically used to couple to the electric fields within the waveguide to a coaxial type connector, such as represented as connector 19. The connector 19, in itself, forms a very short section of coaxial type transmission line and is adapted for coupling to a coaxial type transmission line. Probe 17 is located within waveguide 13 at a position spaced from the end of waveguide, shown connected to the end of iris 11, by a distance equal to:

$$(2N+1)\ (\lambda g1/4),\ N = 0,1, \qquad (1)$$

where $\lambda g1$ is the in-the-guide wavelength of signal frequency $F_{(1)}$, essentially a quarter wavelength or odd multiple thereof at frequency $F_{(1)}$, and is spaced from the other end of the waveguide, shown connected to an end of iris 9, by a distance:

$$(2N+1)\ (\lambda g2/4),\ N = 0,1, \qquad (2)$$

where $\lambda g2$ is the in-the-guide wavelength of microwave signal of frequency $F_{(2)}$, essentially a quarter wavelength or odd multiple thereof at frequency $F_{(2)}$.

This places the probe at a location in the waveguide where the E-field of the signal of frequency $F_{(1)}$ is at a maxima, both maximas being coincident essentially at the location along the waveguide. The in-the-guide wavelength, as is known to those skilled in the art, differs from the wavelength in free space by a factor as is known and described in the literature and is easily ascertainable. And it is apparent to the reader that the integer selected for N in Equation (1) need not be the same integer selected for N in Equation (2).

In operation, oscillator 1 generates microwave frequency signals of frequency $F_{(1)}$ and those signals pass or propagate through the isolator 5 and iris 9 into waveguide 13 and proceed therealong and are coupled to coupling probe 17. The probe couples the energy to the coax connector 19 from which it may be coupled to a coaxial transmission line. Energy of this frequency that propagates further along the waveguide is incident upon iris 11. As may be recalled from the preceding description, iris 11 is effectively an electrical short-circuit at frequency $F_{(1)}$ and reflects that microwave energy. Moreover, inasmuch as this short-circuit is positioned at three-quarters of a wavelength from the coupling probe 17, (taking N=1 in Equation (1)) at an impedance maxima, a high impedance is presented to propagation of microwave energy of frequency $F_{(1)}$ beyond the probe 17. As a result, microwave frequency energy, $F_{(1)}$, is effectively precluded from passing through iris 11 and entering into oscillator $F_{(2)}$ via the output couplings, which prevents loss of power from oscillator $F_{(1)}$ into oscillator $F_{(2)}$.

Conversely, with oscillator 3 operating and generating microwave frequency signals of frequency $F_{(2)}$, the signals $F_{(2)}$ proceed from the output through the associated isolator 7 and through associated iris 11 into waveguide 13 and therealong propagates to coupling probe 17 and thence out the waveguide through the coaxial connector 19, where it may be coupled to a coaxial transmission line, not illustrated. Further, microwave energy of frequency $F_{(2)}$ which passes beyond probe 17 toward iris 9 essentially "sees" an electrical short-circuit and is reflected therefrom. Inasmuch as the effective electrical short-circuit is located three-quarters of a guide wavelength at frequency $F_{(2)}$ from the probe 17, (taking N=1 in Equation (2)) at an impedance maxima, the energy is essentially reflected back so that it is at greatest intensity at probe 17, and effectively propagation of microwave frequencies $F_{(2)}$ beyond probe 17 toward oscillator 1 is inhibited by a high apparent electrical impedance. Thus a substantial portion of the microwave frequency power from oscillator 3 is coupled via probe 17 out connector 19 and essentially little is lost through loading into the oscillator $F_{(1)}$. As is apparent to the reader, the implementation of the disclosed apparatus for coupling two oscillators to a single coaxial line is exceedingly simple and requires only standard components judiciously arranged in accordance with the described principles of the invention.

Figure 3:
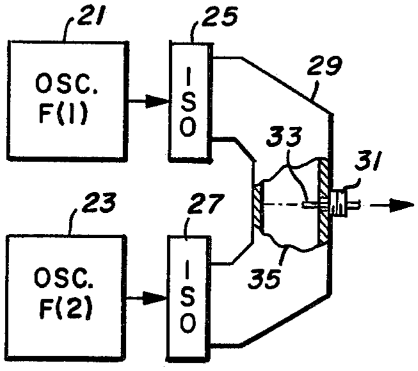
FIG. 3 illustrates a second embodiment of the invention in symbolic form.
Figure 4:
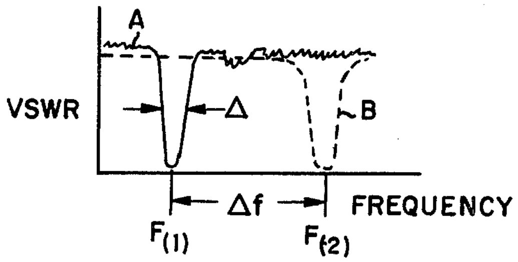
FIG. 4 illustrates graphically the band pass characteristics of isolators used in an embodiment of the invention.

Reference is now made to the embodiment of FIG. 3. In this structure, a pair of conventional solid state microwave frequency oscillators, including oscillator 21 of frequency $F_{(1)}$ and oscillator 23 of frequency $F_{(2)}$, have their outputs connected, respectively, as indicated by the arrows, to narrow band type isolators 25 and 27, respectively, and each isolator is connected serially with a respective end of a waveguide 29. The waveguide, as is apparent, forms a curved path or U so that the two oscillators may be located physically side by side and present a physically compact package. A coaxial connector 31 is included attached to a wall of the waveguide and this is coupled by a probe 33 positioned within the waveguide as made visible by the cut-away portion 35. Each of the isolators 25 and 27 is of a known construction. Typically, isolator 25 has a "bandwidth" or "pass band" characteristic graphically represented in FIG. 4 by Curve A, and isolator 27 is of a similar structure but is tuned to have a "pass band" characteristic around the frequency $F_{(2)}$, generally depicted by the dash line Curve B in FIG. 4. As is apparent from FIG. 4, frequencies $F_{(1)}$ and $F_{(2)}$ are suitably spaced by the difference of $\Delta F$, which is greater than the pass band $\Delta$ depicted in the figure of either of the isolators. Effectively, the isolator passes frequencies in the pass band and acts as a reflector or, in other words, a short-circuit to other frequencies outside that pass band.

Thus, in the embodiment of FIG. 3, isolator 25 is reflective to microwave signals of frequency $F_{(2)}$ originating with oscillator 23, and conversely, isolator 27 is reflective of microwave signals frequency $F_{(1)}$ originating from oscillator 21. In practice, the narrow band type isolators fulfill the same functions performed by the tuned resonant irises 9 and 11, incorporated in the preceding embodiment of FIG. 1. Probe 33 is positioned within waveguide 29 at a distance from the first input end coupled to isolator 25 determined from the following equation:

$$(2N+1)(\lambda g2/4),\ N = 0,1, \qquad (3)$$

where $\lambda g2$ is the in-the-guide wavelength at frequency $F_{(2)}$, essentially a quarter wavelength or multiple thereof and is similarly positioned by a distance from the second input and coupled to isolator 27 determined from the following equation:

$$(2N+1)(\lambda g1/4),\ N = 0,1, \qquad (4)$$

where $\lambda g1$ is the in-the-guide wavelength at frequency $F_{(1)}$, essentially a quarter wavelength or odd multiple thereof. Effectively, with either oscillator 21 activated or oscillator 23 activated to provide the appropriate microwave frequency signals or both oscillators concurrently operating, the electrical effect and function of the elements is the same as that described in connection with the embodiment of FIG. 1. Thus, microwave frequency signals $F_{(2)}$ pass through isolator 27 and propagate to and are coupled to probe 33 where they pass out the coaxial connector 31 to any coaxial type transmission line, not illustrated. Any of the microwave energy of this frequency which passes beyond the probe is reflected by the wall or end of isolator 25 which, because the short-circuit is located at one-quarter of a wavelength or an odd multiple thereof from the probe, reflects energy to a highest intensity point at the location of probe 33, thus preventing the power from microwave oscillator 23 from coupling into oscillator 21 and maintaining a good VSWR. Conversely, the energy from oscillator 21, frequency $F_{(1)}$, passes through isolator 25 and propagates down waveguide 29 where it is coupled to probe 33 and thence out connector 31 to any suitable coaxial type transmission line, and microwave energy which passes beyond the probe is incident upon and reflected by the end of isolator 27 which reflects the energy back over a distance of three-quarters of a wavelength.

Figure 5:
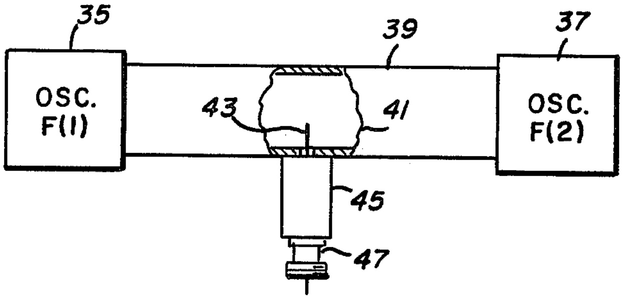
FIG. 5 illustrates a third embodiment of the invention in symbolic form.

A last alternative embodiment which uses a minimum of components is presented in FIG. 5. This includes an oscillator 35, suitably a conventional solid state Gunn diode type which incorporates therein the output, a resonant iris of the type described as Element 9 in the embodiment of FIG. 1. Inasmuch as the resonant iris is incorporated integrally as a standard element within oscillator 35, it is not separately illustrated. A second oscillator 37, capable of generating microwave frequency signals, frequency $F_{(2)}$, is provided and essentially contains a resonant iris type coupling serially with its output, with the iris tuned to frequency $F_{(2)}$. The outputs of the two oscillators are connected to the first and second ends respectively of the waveguide 39, shown as a straight rectangular waveguide. As permitted by the cut-away portion 41, a probe for coupling to E fields in the waveguide 43 is depicted which extends through an opening in the bottom waveguide wall. The coupling is connected to the input of a coaxial type ferrite isolator 45 of conventional structure and the output of isolator 45 is connected to a coaxial type connector 47. In a microwave system, of course, the coaxial type connector 47 will be coupled to any suitable coaxial type waveguide transmission line of known structure. Probe 43 is located at a position within waveguide 39 essentially at a distance from the left end equal to a quarter guide wavelength or odd multiple thereof at a frequency $F_{(2)}$, mathematically represented as $(2N+1)$ $(\lambda g2/4)$, $N = 0,1,\ldots,$ where $\lambda g2$ = guide wavelength at $F_{(2)}$ and at a distance equal to a quarter guide wavelength or odd multiple thereof at a frequency $F_{(1)}$, mathematically represented as $(2N+1)$ $(\lambda g1/4)$, $N = 0,1,\ldots$ where $\lambda g1$ = guide wavelength at $F_{(1)}$ from the right hand end as in the case of the preceding embodiments.

With oscillator 35 activated, microwave frequency signals of frequency $F_{(1)}$, propagate from the output into waveguide 39 and therealong to couple to probe 43. Probe 43 couples this energy through isolator 45 and thence out connector 47 where it may pass to an electrical load, not illustrated. Any energy reflected from the electrical load is blocked from reentering the waveguide by the inherent known operation of isolator 45. Considering any portion of the microwave signal passing beyond probe 43, the tuned iris in oscillator 37 acts as a reflecting surface. Hence any such energy is reflected back down the waveguide, passing over a distance of three-quarters wavelength so as to make the maximum field intensity appear at the probe 43 and permit coupling of this energy out probe 43 through the isolator 45. The converse is true with oscillator 37 which supplies microwave frequency $F_{(2)}$ which propagates into the right hand end of waveguide 39 and therealong into probe 43 where such energy is similarly passed through isolator 45, connector 47, to any suitable coaxial type microwave transmission line and thence to a load, not illustrated. The output of oscillator 35 effectively acts as a short-circuit or reflective surface to energy of frequency $F_{(2)}$ and hence any such energy passing beyond probe 43 to the left-hand end of the waveguide is reflected back. Another way of looking at the effect is that because the short-circuit is located at a distance of three-quarters of a wavelength from the probe, the electrical impedance to propagation of microwave frequency signals beyond the probe is very high. Thus, just as in the preceding embodiments, the embodiment of FIG. 5 provides inherent protection against damage by reason of one oscillator electrically loading down the other oscillator or being damaged by the power output from the other oscillator as well as maximizing energy coupling to the coaxial output.

In the preceding discussions the case was described with either of the oscillators operating. Inasmuch as the system is linear, the theorem of superposition applies and both oscillators may be operated concurrently to provide microwave energy of both frequencies $F_{(1)}$ and $F_{(2)}$ at the coaxial connector.

In each of the embodiments of FIGS. 1, 3 and 5, the transmission line is of a length such that the waveguide is nonresonant, hence the line cannot be equal to one-half wavelength or multiples thereof at the frequency of either of the oscillators $F_{(1)}$ or $F_{(2)}$. The actual physical dimensions of the waveguide is moreover determined from necessity by the express conditions heretofore described, such as in Equations (1) and (2) with respect to FIG. 1, imposed upon the location of the coupling probe, such as probe 17 in FIG. 1. Thus, based on the requirement the line length, L, expressed in terms of wavelengths of both frequencies $F_{(1)}$ and $F_{(2)}$ is obviously equal to the sum of the distances between the probe and the waveguide ends. In the embodiment of FIG. 1:

$$\text{length } L = (2N+1)\lambda g_1/4 + (2N+1)\lambda g_2/4. \quad (5)$$

It is noted that the quantity N in the separate terms need not be the same integer.

To obtain the actual physical length expressed in common terms of dimension, such as centimeters, $\lambda g_1$ is replaced in the foregoing equations by the actual wavelength expressed in terms of centimeters and $\lambda g_2$ is likewise replaced by the actual wavelength length expressed in centimeters. For example, where the selected integer for N is taken as 1 in each of Equations (1) and (2) and in a specific embodiment, the Equation (5) for line length L reduces to:

$$L = \tfrac{3}{4}\lambda g_1 + \tfrac{3}{4}\lambda g_2. \quad (6)$$

Assuming frequency $F_{(1)}$ to be $12 \times 10^9$ hertz and frequency $F_{(2)}$ to be $16 \times 10^9$ hertz in a specific embodiment, using WR-62 rectangular waveguide which is a known structure having walls of electrically conductive material, such as copper, defining an enclosed passage or, more particularly, an enclosed microwave energy propagation path between its ends, $\lambda g_1$ equals 4.08 centimeters and $\lambda g_2$ equals 2.33 centimeters. Hence, the overall length of waveguide 13 in FIG. 1 becomes $(\tfrac{3}{4})(4.08)+(\tfrac{3}{4})(2.33)$ which sums to 4.81 centimeters, and the location of probe 17 is $(\tfrac{3}{4})(2.33)$ or 1.75 centimeters from iris 9.

In the description of the foregoing embodiments of the invention, I have referred to that element which couples the microwave fields as a coupling probe, such as probe 17 in the embodiment of FIG. 1, 33 in the embodiment of FIG. 3, and 43 in the embodiment of FIG. 5, and which I may refer to in a more generic sense as a microwave field coupling means. The term probe is a term used by those skilled in the art to identify the type of coupling for coupling to E-type fields. As those skilled in the art appreciate and understand, the other common type of microwave field coupling means is referred to as a coupling "loop", which couples to the H-type fields within the waveguide in contrast to the E-field. Inasmuch as it is desired to locate the coupler or coupling means at a location of maximum field within the waveguide, whether it be an E-field or an H-field, as is known, the maximum H-field is located one-quarter of a wavelength from the maximum E-field of the signal. Thus where a coupling loop is employed in the practice of the invention in place of a coupling probe, the specific location and waveguide length is necessarily different. Returning again to FIG. 1, by way of example of a further embodiment of the invention in which the coupling means 17 is now identified as a coupling loop, the location of the coupling loop at a distance from the end of waveguide 13 adjacent iris 11 is:

$$N\lambda g_1/2,\ N = 1,2, \quad (7)$$

where $\lambda g_1$ is the in-the-waveguide wavelength of signals of frequency $F_{(1)}$, essentially a half wavelength or even multiple thereof, and is spaced from the other waveguide and adjacent iris 9 by a distance:

$$N\lambda g_2/2,\ N = 1,2, \quad (8)$$

where $\lambda g_2$ is the in-the-waveguide wavelength of microwave signals of frequency $F_{(2)}$; the overall length of the line is seen to be nonresonant at each of the frequencies $F_{(1)}$ or $F_{(2)}$. By way of specific example, choosing the same frequencies and WR-62 waveguide of the prior example $F_{(1)} = 12 \times 10^9$ hertz and $F_{(2)} = 16 \times 10^9$ hertz, and taking $N = 1$ in each of Equations (7) and (8) the coupling loop is located a distance from iris 11 of:

$$N\lambda g_1/2 = (4.08/2) = 2.04 \text{ centimeters} \quad (9)$$

and located a distance from iris 9 of $$N\lambda g_2/2 = (2.33/2) = 1.165 \text{ centimeters} \quad (10)$$

the overall length of the waveguide being the sum of (9) and (10) or 3.205 centimeters.

It should be apparent to those readers skilled in the art that the foregoing description of the structure of the preferred embodiments also reveals an approach to the design of practical devices which embody the invention. The invention obviously is not limited to that suggested design approach and may be more broadly characterized by language defining the resultant invention. Thus in its operation and in the functional relationship of the elements the coupling means is positioned along the waveguide at a location of coincident field maxima, a position where the field maximum of the signals $F_{(1)}$ of one oscillator and the field maximum of the signals $F_{(2)}$ of the other oscillator, comparing the same kinds of fields, E or H by example, are essentially coincident in location along the waveguide. Thus the length of the waveguide is such as to accommodate such a relationship. Diverting to a related subject at this point, it is noted that as previously stated in connection with those embodiments using a coupling probe, the probe location may be described in terms of a location of maximum "propagation impedance", a term conventionally associated with an E-type field maxima. However, use of the foregoing terminology of propagation impedance with respect to the location of a coupling loop and an H-field maximum in the alternative embodiments described in this specification might be considered confusing. Broadly speaking, in considering the reference to a maximum field as used in the claims, the term refers to the same kind of field, E or H, established with microwave energy from each of two oscillators of two different frequencies. Generalizing the characterization of the structure of my invention, essentially by convoluting the design approach previously set forth, it is apparent that the length of the waveguide, such as 13 in FIG. 1, and in all of the embodiments and alternative embodiments heretofore described, is such as to permit establishment therewithin of a field maxima at frequency $F_{(1)}$ at a location therewith and to permit establishment therewithin of a field maxima at frequency $F_{(2)}$ at essentially the same location therewithin as that of the field maxima for $F_{(1)}$ and the microwave coupling means is positioned in the waveguide at the location thereby defined.

It is believed that the foregoing description of the preferred embodiments of my invention is sufficient in detail to enable one skilled in the art to understand and practice the invention. It is expressly understood however that the invention is not to be limited to the details presented for the foregoing purpose, inasmuch as many variations, modifications, even improvements which are equivalent to the elements shown and all of which embody the invention, become apparent to one skilled in the art upon reading this specification. Accordingly, it is respectfully requested that the invention be broadly construed within the full spirit and scope of the claims appended.

What I claim is:

1. A microwave system which includes:

a first oscillator having a waveguide type output for generating a microwave frequency signal of frequency $F_{(1)}$;

a second oscillator having a waveguide type output for generating a microwave frequency signal of frequency $F_{(2)}$; said first frequency $F_{(1)}$ being different from said second frequency $F_{(2)}$ by a difference $\Delta F$;

a rectangular waveguide having first and second ends for receiving microwave frequency signals, said waveguide being of a predetermined length L extending between said ends; said predetermined length being different from a one-half guide wavelength or multiple thereof at either of the frequencies $F_{(1)}$ and $F_{(2)}$ for making said line non-resonant at such frequencies;

first means associated with said first oscillator for coupling the output of said first oscillator means to the first end of said waveguide;

second means associated with said second oscillator for coupling the output of said second oscillator to the second end of said waveguide;

said first means possessing the characteristic of passing microwave frequency signals $F_{(1)}$ between said waveguide and said first oscillator and essentially reflecting microwave signals of frequency $F_{(2)}$ between said waveguide and said first oscillator at said first waveguide end;

said second means possessing the characteristic of passing microwave signals of frequency $F_{(2)}$ between said waveguide and said second oscillator and essentially reflecting microwave signals of frequency $F_{(1)}$ between said waveguide and said second oscillator at said second waveguide end; and a microwave energy coupling probe for coupling microwave energy from within the waveguide, said probe being positioned at a predetermined location along said waveguides between the first and second ends; said location being defined by a distance of $(2N_a+1)\ \lambda g_1/4$ at frequency $F_{(1)}$ from said second waveguide end and $(2N_b+1)\ \lambda g_2/4$ at frequency $F_{(2)}$ from said first waveguide end, where $N_a$ is zero or an integer 1, 2 . . . *n*, $N_b$ is zero or an integer 1, 2 . . . *n*, $\lambda g_1$ is the in-the-guide wavelength of signals of frequency $F_{(1)}$ and $\lambda g_2$ is the in-the-guide wavelength of frequencies $F_{(2)}$; and coaxial type ferrite isolator means having a pass band characteristic which includes signals of frequency $F_{(1)}$ and $F_{(2)}$; and wherein said microwave frequency coupling probe is coupled to an input of said isolator means; and coaxial type connector means coupled to an output of said isolator means for permitting signals to be coupled to a coaxial type transmission line.

2. The invention as defined in claim 1 wherein said first means comprises a resonant iris resonant at frequency $F_{(1)}$ and wherein said second means comprises a resonant iris resonant at a frequency $F_{(2)}$.

3. A microwave system which includes:

a first oscillator having a waveguide type output for generating a microwave frequency signal of frequency $F_{(1)}$;

a second oscillator having a waveguide type output for generating a microwave frequency signal of frequency $F_{(2)}$; said first frequency $F_{(1)}$ being different from said second frequency $F_{(2)}$ by a difference $\Delta F$;

a rectangular waveguide having first and second ends for receiving microwave frequency signals, said waveguide being of a predetermined length L extending between said ends; said predetermined length being different from a one-half guide wavelength or multiple thereof at either of the frequencies $F_{(1)}$ and $F_{(2)}$ for making said line non-resonant at such frequencies;

first means associated with said first oscillator for coupling the output of said first oscillator means to the first end of said waveguide;

second means associated with said second oscillator for coupling the output of said second oscillator to the second end of said waveguide;

said first means possessing the characteristic of passing microwave frequency signals $F_{(1)}$ between said waveguide and said first oscillator and essentially reflecting microwave signals of frequency $F_{(2)}$ between said waveguide and said first oscillator at said first waveguide end;

said second means possessing the characteristic of passing microwave signals of frequency $F_{(2)}$ between said waveguide and said second oscillator and essentially reflecting microwave signals of frequency $F_{(1)}$ between said waveguide and said second oscillator at said second waveguide end; and a microwave energy coupling probe for coupling microwave energy from within the waveguide, said probe being positioned at a predetermined location along said waveguides between the first and second ends; said location being defined by a distance of $(2N_a+1)\ \lambda g_1/4$ at frequency $F_{(1)}$ from said second waveguide end and $(2N_b+1)\ \lambda g_2/4$ at frequency $F_{(2)}$ from said first waveguide end, where $N_a$ is zero or an integer 1, 2 . . . *n*, $N_b$ is zero or an integer 1, 2 . . . *n*, $\lambda g_1$ is the in-the-guide wavelength of signals of frequency $F_{(1)}$ and $\lambda g_2$ is the in-the-guide wavelength of frequencies $F_{(2)}$; and wherein said first means comprises an isolator having a narrow pass band, $\Delta$, where $\Delta$ is smaller than $F_{(1)}-F_{(2)}$, and wherein said second means comprises an isolator having a narrow pass band, $\Delta$, where $\Delta$ is less than $F_{(1)}-F_{(2)}$.

4. A microwave system which includes:

a first oscillator having a waveguide type output for generating a microwave frequency signal of frequency $F_{(1)}$;

a second oscillator having a waveguide type output for generating a microwave frequency signal of frequency $F_{(2)}$; said first frequency $F_{(1)}$ being different from said second frequency $F_{(2)}$ by a difference $\Delta F$;

a rectangular waveguide having first and second ends for receiving microwave frequency signals, said waveguide being of a predetermined length L extending between said ends; said predetermined length being different from a one-half guide wavelength or multiple thereof at either of the frequencies $F_{(1)}$ and $F_{(2)}$ for making said line non-resonant at such frequencies;

first means associated with said first oscillator for coupling the output of said first oscillator means to the first end of said waveguide;

second means associated with said second oscillator for coupling the output of said second oscillator to the second end of said waveguide;

said first means possessing the characteristic of passing microwave frequency signals $F_{(1)}$ between said waveguide and said first oscillator and essentially reflecting microwave signals of frequency $F_{(2)}$ between said waveguide and said first oscillator at said first waveguide end;

said second means possessing the characteristic of passing microwave signals of frequency $F_{(2)}$ between said waveguide and said second oscillator and essentially reflecting microwave signals of frequency $F_{(1)}$ between said waveguide and said second oscillator at said second waveguide end; and a microwave energy coupling probe for coupling microwave energy from within the waveguide, said probe being positioned at a predetermined location along said waveguides between the first and second ends; said location being defined by a distance of $(2N_a+1)\ \lambda g_1/4$ at frequency $F_{(1)}$ from said second waveguide end and $(2N_b+1)\ \lambda g_2/4$ at frequency $F_{(2)}$ from said first waveguide end, where $N_a$ is zero or an integer 1, 2 . . . *n*, $N_b$ is zero or an integer 1, 2 . . . *n*, $\lambda g_1$ is the in-the-guide wavelength of signals of frequency $F_{(1)}$ and $\lambda g_2$ is the in-the-guide wavelength of frequencies $F_{(2)}$; and wherein said first means comprises an isolator and a resonant iris coupled in series, and wherein said second means comprises an isolator and a resonant iris coupled in series.

5. A microwave system which includes:

a first oscillator having a waveguide type output for generating a microwave frequency signal of frequency $F_{(1)}$;

a second oscillator having a waveguide type output for generating a microwave frequency signal of frequency $F_{(2)}$; said first frequency $F_{(1)}$ being different from said second frequency $F_{(2)}$ by a difference $\Delta F$;

a rectangular waveguide having first and second ends for receiving microwave frequency signals, said waveguide being of a predetermined length L extending between said ends; said predetermined length being different from a one-half guide wavelength or multiple thereof at either of the frequencies $F_{(1)}$ and $F_{(2)}$ for making said line non-resonant at such frequencies;

first means associated with said first oscillator for coupling the output of said first oscillator means to the first end of said waveguide;

second means associated with said second oscillator for coupling the output of said second oscillator to the second end of said waveguide;

said first means possessing the characteristic of passing microwave frequency signals $F_{(1)}$ between said waveguide and said first oscillator and essentially reflecting microwave signals of frequency $F_{(2)}$ between said waveguide and said first oscillator at said first waveguide end;

said second means possessing the characteristic of passing microwave signals of frequency $F_{(2)}$ between said waveguide and said second oscillator and essentially reflecting microwave signals of frequency $F_{(1)}$ between said waveguide and said second oscillator at said second waveguide end; and a microwave energy coupling probe for coupling microwave energy from within the waveguide, said probe being positioned at a predetermined location along said waveguides between the first and second ends; said location being defined by a distance of $(2N_a+1)\ \lambda g_1/4$ at frequency $F_{(1)}$ from said second waveguide end and $(2N_b+1)\ \lambda g_2/4$ at frequency $F_{(2)}$ from said first waveguide end, where $N_a$ is zero or an integer 1, 2 . . . $n$, $N_b$ is zero or an integer 1, 2 . . . $n$, $\lambda g_1$ is the in-the-guide wavelength of signals of frequency $F_{(1)}$ and $\lambda g_2$ is the in-the-guide wavelength of frequencies $F_{(2)}$; and wherein said first means comprises a resonant iris integrally formed with said first oscillator means and wherein said second means comprises a resonant iris integrally formed within said second oscillator means.

6. The invention as defined in claim 5 wherein said waveguide defines a curved geometry over the length thereof.

7. In a microwave system containing first and second microwave signal source means of frequencies $F_{(1)}$ and $F_{(2)}$, respectively, each of said source means having a means associated therewith having an electrical characteristic of passing microwave signals of the respective output frequency and essentially reflecting signals of the other frequency; and the improved means for coupling the outputs of said respective source means in common to a coaxial type output, which comprises in combination:

a rectangular waveguide having first and second ends coupled respectively to a corresponding one of said first and second microwave means for receiving therewithin microwave frequency signals of $F_{(1)}$ and $F_{(2)}$, said waveguide defining an enclosed microwave energy propagation path between said ends and being nonresonant at either frequency $F_{(1)}$ or $F_{(2)}$; said waveguide being of a predetermined length L wherein a point of maximum field for each of said microwave frequency signals of $F_{(1)}$ and $F_{(2)}$ is coincident at a particular location defined as $N_a\ \lambda g_1/2$ at frequency $F_{(1)}$ from the end of the waveguide associated with oscillator $F_{(2)}$ and $N_b\ \lambda g_2/2$ at frequency $F_{(2)}$ from the end of the waveguide associated with oscillator $F_{(1)}$; and where the quantity $N_a$ is an integer selected from the group 1, 2 . . . $n$; $N_b$ is an integer selected from the group 1, 2 . . . $n$; $\lambda g_1$ is an in-the-guide wavelength at frequency $F_{(1)}$; $\lambda g_2$ is an in-the-guide wavelength at frequency $F_{(2)}$; and microwave energy coupling means comprising a coupling loop for coupling to H-type fields to couple microwave energy from within to without said waveguide positioned within said waveguide at said particular location; and wherein said first microwave signal source means includes a first resonant iris, said resonant iris being resonant at a frequency $F_{(1)}$ and coupled to said first waveguide end, and wherein said second microwave signal source means includes a second resonant iris, said resonant frequency being resonant at a frequency $F_{(2)}$ and coupled to said second waveguide end.

8. The invention as defined in claim 7 wherein said first microwave signal source means further includes an isolator, said isolator being coupled in series with said first included resonant iris and wherein said second microwave signal source means further includes an isolator, said isolator being coupled in series with said second included resonant iris.

* * * * *